United States Patent [19]

Fujimura

[11] Patent Number: 5,078,824

[45] Date of Patent: Jan. 7, 1992

[54] SEMICONDUCTOR DEVICE MANUFACTURING APPARATUS

[75] Inventor: Shuzo Fujimura, Tokyo, Japan

[73] Assignee: Fujitsu Limited, Kawasaki, Japan

[21] Appl. No.: 492,139

[22] Filed: Mar. 13, 1990

[30] Foreign Application Priority Data

Mar. 14, 1989 [JP] Japan .................................. 1-61252

[51] Int. Cl.[5] ...................... B44C 1/22; H01L 21/306; C03C 15/00; C03C 25/06
[52] U.S. Cl. .................................... 156/345; 156/643; 156/646; 204/298.01
[58] Field of Search ....................... 156/643, 646, 345; 204/192.1, 192.12, 192.32, 298; 118/50.1, 620, 715, 719, 728; 427/38, 39

[56] References Cited

U.S. PATENT DOCUMENTS

| | | | |
|---|---|---|---|
| 4,252,595 | 2/1981 | Yamamoto et al. | 156/345 |
| 4,666,734 | 5/1987 | Kamiya et al. | 118/719 X |
| 4,927,484 | 5/1990 | Mitomi | 118/719 X |

Primary Examiner—William A. Powell
Attorney, Agent, or Firm—Staas & Halsey

[57] ABSTRACT

A semiconductor double-chamber etching apparatus which can be manually operated in a maintenance area by connecting a movable manual operation panel, with a communication device, to any one of a plurality of relay stations provided on the etching apparatus facing maintenance area. In this case, the manual operation panel of the etching apparatus provided on a face of the etching apparatus facing a clean room is not used. The clean room is adjacent to the maintenance area, and is separated from the maintenance room by a partition wall.

29 Claims, 3 Drawing Sheets

SEMICONDUCTOR DEVICE MANUFACTURING APPARATUS

BACKGROUND OF THE INVENTION (1) Field of the Invention

The present invention relates to a semiconductor device manufacturing apparatus for manufacturing a semiconductor device such as a semiconductor integrated circuit.

With remarkable development in ultra-miniaturization and high packing density of semiconductor devices such as LSI and VLSI, the dust-free and vibration-proof working environment is a very important factor for improvement in the manufacturing yield of semiconductor devices. Recently, a variety of measures have been taken for attaining the dust-free and vibration-proof working environment. However, it is not easy to always maintain the semiconductor device manufacturing apparatus at the optimum condition under such a specially designed working environment because maintenance of the semiconductor manufacturing apparatus is always accompanied by a variety of difficulties.

(2) Description of the Prior Art

FIG. 1 schematically shows an etching apparatus and working environment thereof as an example of the conventional semiconductor device manufacturing apparatus. An etching apparatus is constituted by a working area 1 including the etching chamber, a vacuum pump 2 for evacuating gas within the working area 1, and a DC power supply 3 and a high frequency power supply 4 to supply the DC power and high frequency power to the working area 1, which are independently installed.

Moreover, as shown in FIG. 1, the working area 1 is provided with partition walls 7a and 7b to provide two separated chambers i.e., a maintenance region 8 and wafer treating region 9. The operation panel 5 and the wafer loading and unloading area 6 are provided in the wafer treating region 9, while the other accessory apparatus of etching apparatus are provided in the maintenance region 8. The wafer treating region 9 is a chamber called a clean room used for loading or unloading and transferring wafers. Therefore, a degree of cleanliness is kept higher than that of the maintenance region 8.

In this example, a vacuum pump 2, a DC power supply 3 and a high frequency power supply 4 are considered as the source of dust and vibration, and separated from the working area 1 and installed in the maintenance region 8. Accordingly, a degree of cleanliness of the wafer treating region 9 is kept high. In some cases, the vacuum pump 2, DC power supply 3 and high frequency power supply 4 are installed separately in another room.

As described previously, the water treating region 9 is never contaminated by dust generated in the maintenance region 8 during operation of the etching apparatus.

However, maintenance or repair of such etching apparatus as installed in the special environment as explained above results in following several problems.

When the operation panel 5 is operated in the wafer treating region 9 or when it is requested to watch the inside of working area 1 and to watch the condition of vacuum pump 2, DC power supply 3 or high frequency power supply 4 in processing the semiconductor device, a maintenance engineer 11 who is operating the operation panel 5 must request cooperation of the maintenance engineer 10 watching the respective apparatus in the maintenance region 8 and therefore at least two persons are required.

In case the vacuum pump 2, DC power supply 3 or high frequency power supply 4 are installed in the room other than that wherein the working area 1 is provided, the maintenance engineers 10 and 11 are requested to make conversation through the telephone or transceiver.

In the case of watching the transitional stages in each process to be sequentially conducted by the semiconductor device manufacturing apparatus, fine adjustment of operation such as start and stop of the semiconductor device fabrication apparatus is sometimes conducted. In this case, a maintenance engineer 10 conducts such adjustments while issuing instructions to another maintenance engineer 11. However, difference is generated between instruction for operation and actual operation timing and deviation in operations are inevitable and thereby it becomes difficult to conduct the maintenance work considered.

If a maintenance engineer conducts the maintenance work only by himself, the partition walls 7a, 7b are partially opened and he must go and come back between the wafer treating region 9 wherein the operation panel 5 is installed and the maintenance area 8 wherein the each apparatus is installed. As a result, the wafer treating region 9 is naturally contaminated by dust.

In the case of a semiconductor manufacturing apparatus such as a stepper, the working area 1 of apparatus is set in a constant temperature chamber in order to prevent expansion and contraction of an apparatus due to temperature change. The operation panel is separated from the working area so that the temperature controlling condition is never broken, even when the chamber is opened for operation.

Moreover, the manual operation panel of the operating panel 5 is sometimes provided independently for the centralized control of the conditions of the semiconductor device manufacturing apparatus.

In any case, however, the apparatus is connected to the manual operating panel at the predetermined one area. Therefore, the maintenance work for the semiconductor device manufacturing apparatus has always been accompanied by difficulty as mentioned above.

Namely, the maintenance work for the semiconductor device manufacturing apparatus installed in the specially designed environment has usually resulted various problems. For example, working flexibility is bad, work efficiency is also bad and the wafer treating area is contaminated by dust.

SUMMARY OF THE INVENTION

It is an object of the present invention to provide a semiconductor device manufacturing apparatus which ensures high working flexibility and efficiency of the maintenance work.

It is another object of the present invention to provide a semiconductor device manufacturing apparatus which ensures high quality maintenance work.

Such objects may be achieved by a semiconductor device manufacturing apparatus which can be manually operated by maintenance engineers. Namely, the manual operation panel for operating manually the semiconductor device manufacturing apparatus is provided independently and movably from the semiconductor device manufacturing apparatus. On the other hand, the semiconductor device manufacturing apparatus is provided with a plurality of relay stations for communication with the manual operation panel. A maintenance engineer is capable of conducting the maintenance work by manual operation of the semiconductor device manufacturing apparatus through wired communication between the relay station nearest the maintenance field and the manual operation panel. Thereby, avoiding a longer communication cable, which results in interference with the maintenance room.

Accordingly, only a maintenance engineer is capable of monitoring the conditions of the semiconductor device manufacturing apparatus and conducting the maintenance work while he is operating such semiconductor device manufacturing apparatus. As a result, devation in the operation timing which may be often generated in the maintenance work conducted by two or more persons can be eliminated and the fine adjustment can also be realized.

As explained previously, the present invention has improved the maintenance work efficiency and quality and simultaneously solved a problem of contamination by dust of the wafer treating region. As a result, a semiconductor device manufacturing apparatus which can always maintain the best condition can be realized.

DESCRIPTION OF THE PREFERRED EMBODIMENTS

Figure 1:
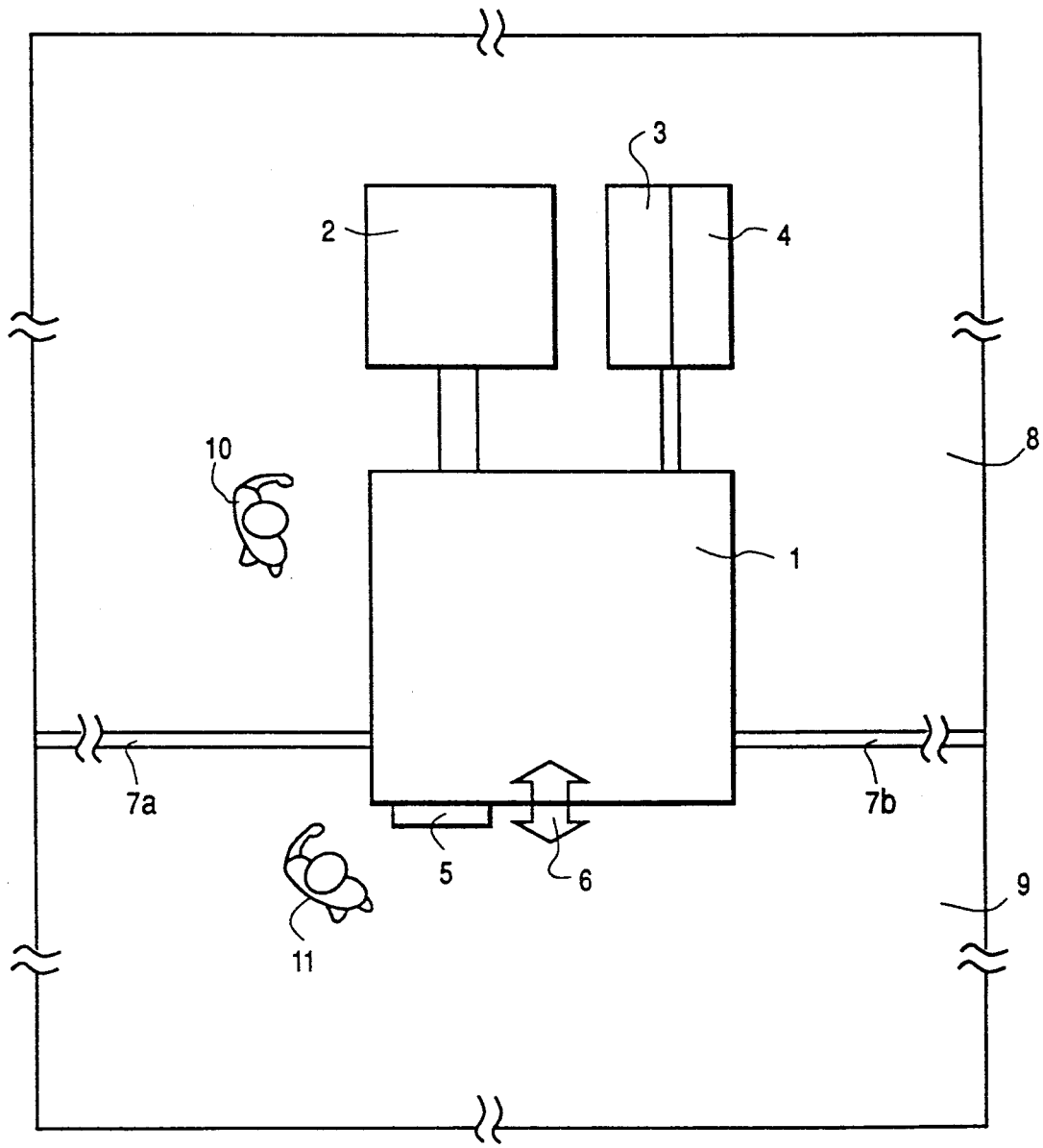
FIG. 1 is a schematic diagram indicating an etching apparatus and its working environment as an example of the conventional semiconductor device manufacturing apparatus.

An embodiment of the present a invention will be explained hereunder with reference to FIGS. 2 and 3.

The like reference numerals and symbols indicate the like element or apparatus in these figures.

Figure 2:
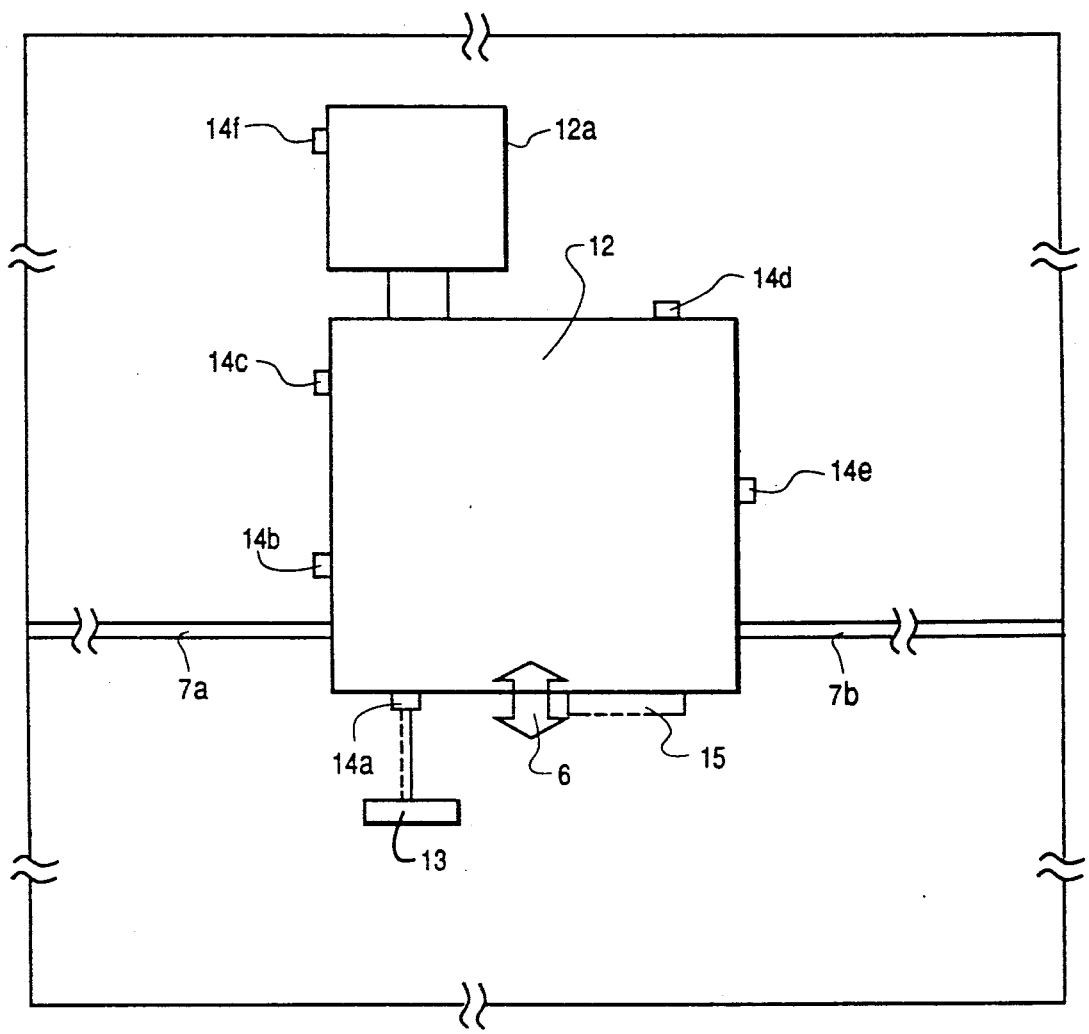
FIG. 2 is a schematic plan view for explaining the basic principle of an embodiment of the present invention.

FIG. 2 is a schematic diagram for explaining the basic principle of the embodiment of the present invention. The semiconductor device manufacturing apparatus of an present invention is characterized in that a maintenance engineer can operate the fabrication apparatus in the maintenance region by his own hands. Namely, the manual operation panel 13 for manually operating the semiconductor device manufacturing apparatus 12 is installed independently and movably from the semiconductor device manufacturing apparatus 12. Meanwhile, the semiconductor device manufacturing apparatus 12 is provided with a plurality of relay stations 14a, 14b, 14c, 14d, 14e, 14f, . . . for communication with the manual operation panel 13. The maintenance engineer is capable of manually operating the semiconductor device manufacturing apparatus 12 through the wired-communication between at least any one of the relay stations 14a, 14b, 14c, 14d, 14e, 14f, . . . and the manual operation panel 13. It is of course unnecessary to limit the communication between the relay station and manual operation panel 13 to the wired-communication and a radio communication can also be employed. Moreover, the semiconductor device manufacturing apparatus 12 is associated by a plurality of accessory devices 12a, 12b, 13c, . . . (only 12a is illustrated. In case such accessory devices are separately installed, each accessory device is respectively provided with a relay station for making communication with the manual operation panel 13 (for instance, a relay station 14f).

When the automatic operation panel 15 for automatically operating the semiconductor device manufacturing apparatus 12 is provided with the semiconductor device manufacturing apparatus 12, it is convenient that the relay station 14a is provided in the same plane as that providing the automatic operation panel 15.

For the wired-communication between the manual operation panel and relay station, both devices are electrically connected by a wire cable and connector. Moreover, in case an optical fiber cable is used in place of the wire cable, the manual operation panel and relay station are optically coupled with an optical connector.

When the radio communication is carried out between the manual operation panel and relay station, a receiver or transceiver tuned to the predetermined frequency is provided at the relay station and on the other hand, the manual operation panel is provided with a transmitter or transceiver tuned to the frequency mentioned above.

Therefore, an maintenance engineer is capable of manually operating the semiconductor device manufacturing apparatus 12 by sending the operation signal of manual operation panel to the relay station. Moreover, in case transceivers are provided both in the manual operation panel and relay station, the condition signal of the semiconductor device manufacturing apparatus can be transmitted to the manual operation panel 13.

The same fuction as that described above can also be attained by providing only the antenna at the relay station and on the other hand a receiver or transceiver at the semiconductor device manufacturing apparatus.

In addition, such communication can also be realized with an infrared transceiver.

Figure 3:
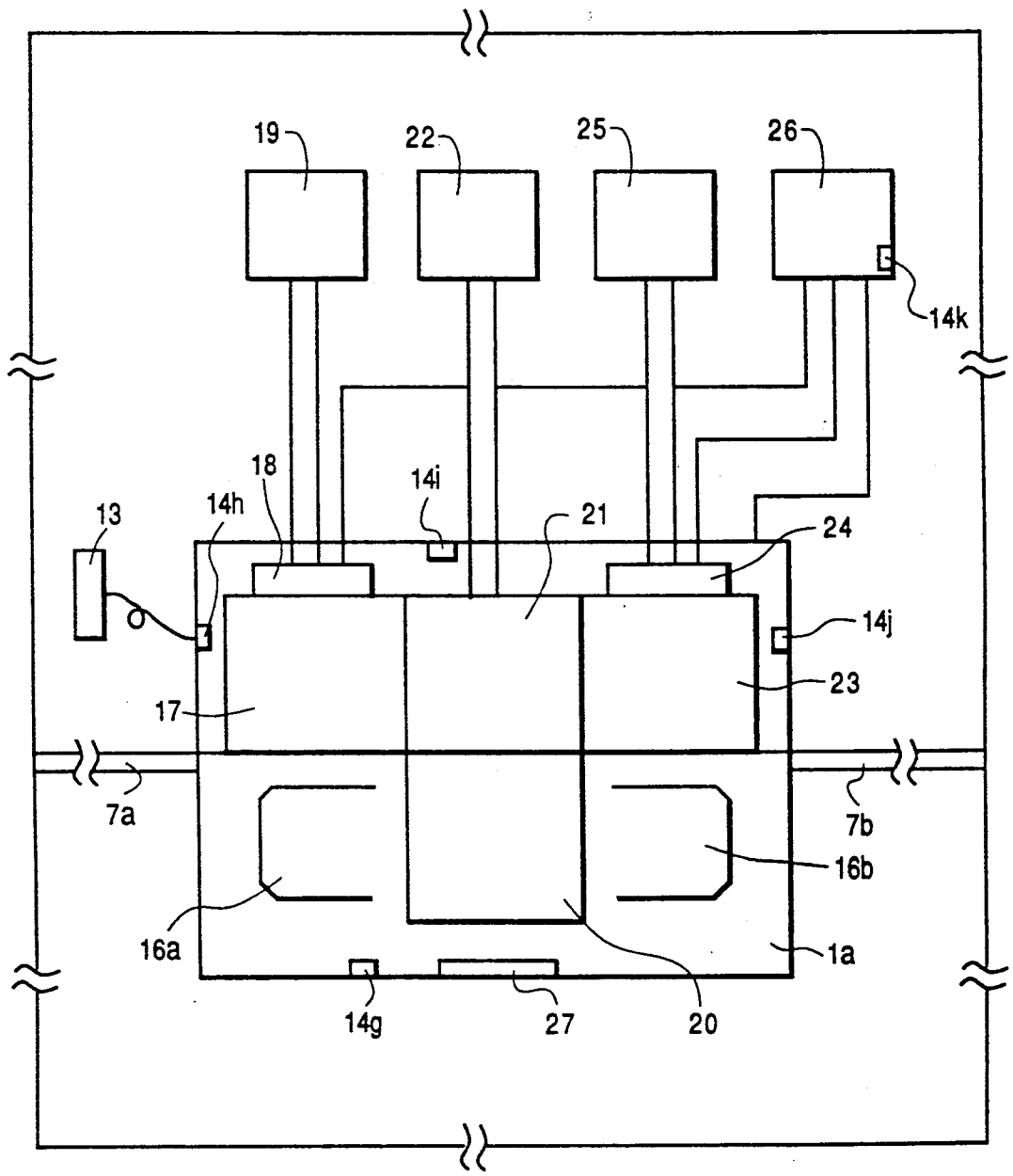
FIG. 3 is a schematic plan view for explaining the 2-chamber system etching apparatus as an embodiment of the semiconductor device manufacturing apparatus of the present invention.

FIG. 3 is a schematic plan view for explaining an embodiment of the semiconductor device manufacturing of the present invention.

The present semiconductor device manufacturing apparatus is of the two-chamber system etching apparatus type, comprising the RIE (Reactive Ion Etching) chamber 23 and a down-flow chamber 17.

The etching process by the apparatus of the present invention can be outlined as follow. A carrier accommodating a plurality of wafers is loaded at the carrier stations 16a, 16b and is then carried to a load lock chamber 20. Next, the load lock chamber 20 is evacuated to a vacuum condition by a vacuum pump 22 and thereafter the wafers are carried to the carrying chamber 21 which is previously evacuated to a vacuum condition. Then, the wafers are respectively carried, as designated, to the down-flow chamber 17 and RIE chamber 23 which are already evacuated to a vacuum condition. Since a reaction gas is supplied to the down-flow chamber 17 through a gas piping system 18 and to the RIE chamber 23 through a gas piping system 24, wafer etching work can be done. Upon completion of the etching work, the wafers are accommodated again in the carrier in the carrier stations 16a and 16b through the load lock chamber 20, thus completing total process.

In this etching apparatus, in addition to the working area 1a to conduct the etching work, the four kinds of accessory devices of (1) a vacuum pump 19 for down-flow chamber 17 to evacuate the down-flow chamber to the vacuum condition, (2) a vacuum pump 22 for transfer chamber and load lock to evacuate the transfer chamber 21 and load lock chamber 20 to the vacuum condition, (3) a vacuum pump 25 for RIE chamber to evacuate the RIE chamber 23 to the vacuum condition, (4) a power supply rack 26 accommodating the DC power supply and high frequency power supply for conducting the etching work and the power supply for supplying the power to the working area 1a are independently provided separate from the working area 1a.

Meanwhile, the etching apparatus is controlled by a microcomputer system (not illustrated) provided in the working area 1a and running operations are carried out by operations at the operation panel and display area 27.

In this etching apparatus, the relay station (1) 14g is provided at the front surface, wherein the operation panel and display area 27 also provided; the relay station (2) 14h, to the left side surface, where the downflow chamber 17 is provided; the relay station (3) 14i, to the rear surface, where the transfer chamber 21 is provided; the relay station (4) 14j, to the right side surface, where the RIE chamber 23 is provided; and the relay station (5) 14k, to the power supply rack 26, respectively.

The relay stations are connected to the manual operation panel 13 and microcomputer system for control with a wire cable. Namely the manual operations of etching apparatus can be realized by sending the operation signal of manual operation panel 13 to the microcomputer system for control by the relay stations.

Therefore, if a trouble occurs, for example, in the down-flow chamber 17, transfer system in the periphery thereof and a gas system, the maintenance work is carried out by connecting the manual operation panel 13 to the nearest relay station (2) 14h. In addition, if a failure occurs in the display area 27, the manual operation panel 13 is connected to the nearest relay station (1) 14g in order to confirm correspondence between the operation and and display. Moreover, manual operation panel 13 may be connected in the same way to the other relay stations, i.e., relay station (3) 14i, relay station (4) 14j and relay station (5) 14k, and is connected to the nearest relay station to the maintenance work field requiring maintenance work. Of course, operation by the operation panel in clean room side automatically becomes impossible, when the manual operation is carried out by the manual operation panel in the maintenance region.

The manual operation panel 13 provides the operation commands for automatic operation in addition to the operation commands for manual operation and realizes both manual and automatic operations even in any maintenance field.

As a result, the maintenance period has been curtailed by 15% or more in the case of the embodiment of the present invention. Moreover, the maintenance work can be conducted by only a maintenance engineer.

In this embodiment, the maintenance work by the movable manual operation panel has been explained but if there is a manual operation panel fixed to the semiconductor device fabrication apparatus in the maintenance region, it can naturally be used. However, from the point of view of working flexibility of maintenance work, the movable type manual operation panel is more preferable.

In this embodiment, a semiconductor etching apparatus has been described as the semiconductor device manufacturing apparatus.

However, the present invention can also be applied to such a semiconductor device fabrication apparatus as MOCVD (Metal Organic Chemical Vapor Deposition).

What is claimed is:

1. An apparatus for manufacturing semiconductor devices, having a first part installed on one side of a partition wall and a second part installed on the other side of the partition wall, said apparatus comprising:
   first control means provided in said first part of said semiconductor device manufacturing apparatus to operate said apparatus; and
   a second control means provided in said second part of said semiconductor device manufacturing apparatus to operate said apparatus.

2. An apparatus for manufacturing semiconductor devices according to claim 1, wherein said apparatus further comprises means for evacuation attached to said second part of said semiconductor device manufacturing apparatus.

3. An apparatus for manufacturing semiconductor devices according to claim 1, wherein said first control means is installed in a room on one side of said partition wall, said room has a degree of cleanliness that is higher than that of another room where said second control means is installed.

4. An apparatus for manufacturing semiconductor devices according to claim 1, wherein said second control means is fixed to the second part of said semiconductor device manufacturing apparatus.

5. An apparatus for manufacturing semiconductor devices according to claim 1, wherein said apparatus includes means for controlling said first control means and second control means so that only one of the control means can be operated at one time.

6. An apparatus for manufacturing semiconductor devices according to claim 1, wherein at least one of said first and second control means comprises movable operation panel means for operating said apparatus; and communication means for intercommunication between said operation panel means and said apparatus.

7. An apparatus for manufacturing semiconductor devices according to claim 6, wherein said communication means includes a relay station, said second part of said semiconductor device manufacturing apparatus includes said movable operation panel means, said movable operation panel means is connected to said relay station.

8. An apparatus for manufacturing semiconductor devices according to claim 6, wherein said first and second control means comprises an operation panel fixed to said first part and second part of said semiconductor device manufacturing apparatus, respectively.

9. An apparatus for manufacturing semiconductor devices according to claim 6, wherein said communication means is selected from the the group consisting of wired-communication means, radio communication means and optical communication means.

10. An apparatus for manufacturing semiconductor devices according to claim 4 wherein said semiconductor device manufacturing apparatus is an etching apparatus.

11. An apparatus for manufacturing semiconductor devices according to claim 4 wherein said semiconductor device manufacturing apparatus is a CVD (Chemical Vapor Deposition) apparatus.

12. An apparatus for manufacturing semiconductor devices according to claim 4, wherein said apparatus further comprising:

a first processing chamber;

a second processing chamber for conducting a process different from that conducted in said first processing chamber;

a load lock chamber means for at least one of loading and unloading a substrate to be processed in said first and second processing chamber;

a vacuum pump means for independently evacuating at least one of said first and second processing chambers and said load lock chambers means to a vacuum condition;

a gas supplying means for independently supplying the reactant gas to at least one of said first and second processing chamber;

a power supply means for supplying power for at least one of
  i) processing in at least one of said first and second processing chamber, and
  ii) evacuating said chambers to the vacuum condition; and a processing control means for controlling the processings in at least one of said first and second processing chambers.

13. An apparatus for manufacturing semiconductor devices according to claim 10, wherein said first processing chamber is an RIE (Reactive Ion Etching) chamber and said second processing chamber is a chamber where down stream etching is performed.

14. An apparatus for manufacturing semiconductor devices according to claim 10, wherein said first processing chamber is an RIE (Reactive Ion Etching) chamber or plasma etching chamber and said second processing chamber is an CVD (Chemical Vapor Deposition) chamber.

15. An apparatus for manufacturing semiconductor devices according to claim 5, wherein said semiconductor device manufacturing apparatus is an etching apparatus.

16. An apparatus for manufacturing semiconductor devices according to claim 5, wherein said semiconductor device manufacturing apparatus is a CVD (Chemical Vapor Deposition) apparatus.

17. An apparatus for manufacturing semiconductor devices according to claim 5, wherein said apparatus further comprising:

a first processing chamber;

a second processing chamber for conducting a process different from that conducted in said first processing chamber;

a load lock chamber means for at least one of loading and unloading a substrate to be processed in said first and second processing chamber;

a vacuum pump means for independently evacuating at least one of said first and second processing chambers and said load lock chambers means to a vacuum condition;

a gas supplying means for independently supplying the reactant gas to at least one of said first and second processing chamber;

a power supply means for supplying power for at least one of
  i) processing in at least one of said first and second processing chamber, and
  ii) evacuating said chambers to the vacuum condition; and a processing control means for controlling the processing in at least one of said first and second processing chambers.

18. An apparatus for manufacturing semiconductor devices according to claim 6, wherein said semiconductor device manufacturing apparatus is an etching apparatus.

19. An apparatus for manufacturing semiconductor devices according to claim 6, wherein said semiconductor device manufacturing apparatus is a CVD (Chemical Vapor Deposition) apparatus.

20. An apparatus for manufacturing semiconductor devices according to claim 6, wherein said apparatus further comprising:

a first processing chamber;

a second processing chamber for conducting a process different from that conducted in said first processing chamber;

a load lock chamber means for at least one of loading and unloading a substrate to be processed in said first and second processing chamber;

a vacuum pump means for independently evacuating at least one of said first and second processing chambers and said load lock chambers means to a vacuum condition;

a gas supplying means for independently supplying the reactant gas to at least one of said first and second processing chamber;

a power supply means for supplying power for at least one of
  i) processing in at least one of said first and second processing chamber, and
  ii) evacuating said chambers to the vacuum condition; and a processing control means for controlling the processing in at least one of said first and second processing chambers.

21. An apparatus for manufacturing semiconductor devices according to claim 7, wherein said semiconductor device manufacturing apparatus is an etching apparatus.

22. An apparatus for manufacturing semiconductor devices according to claim 7, wherein said semiconductor device manufacturing apparatus is a CVD (Chemical Vapor Deposition) apparatus.

23. An apparatus for manufacturing semiconductor devices according to claim 7, wherein said apparatus further comprising:

a first processing chamber;

a second processing chamber for conducting a process different from that conducted in said first processing chamber;

a load lock chamber means for at least one of loading and unloading a substrate to be processed in said first and second processing chamber;

a vacuum pump means for independently evacuating at least one of said first and second processing chambers and said load lock chambers means to a vacuum condition;

a gas supplying means for independently supplying the reactant gas to at least one of said first and second processing chamber;

a power supply means for supplying power for at least one of
  i) processing in at least one of said first and second processing chamber, and
  ii) evacuating said chambers to the vacuum condition; and a processing control means for controlling the processing in at least one of said first and second processing chambers.

24. An apparatus for manufacturing semiconductor devices according to claim 15, wherein said first processing chamber is an RIE (Reactive Ion Etching) chamber and said second processing chamber is a chamber where down stream etching is performed.

25. An apparatus for manufacturing semiconductor devices according to claim 18, wherein said first processing chamber is an RIE (Reactive Ion Etching) chamber and said second processing chamber is a chamber where down stream etching is performed.

26. An apparatus for manufacturing semiconductor devices according to claim 21, wherein said first processing chamber is an RIE (Reactive Ion Etching) chamber and said second processing chamber is a chamber where down stream etching is performed.

27. An apparatus for manufacturing semiconductor devices according to claim 15, wherein said first processing chamber is an RIE (Reactive Ion Etching) chamber or plasma etching chamber and said second processing chamber is an CVD (Chemical Vapor Deposition) chamber.

28. An apparatus for manufacturing semiconductor devices according to claim 18, wherein said first processing chamber is an RIE (Reactive Ion Etching) chamber or plasma etching chamber and said second processing chamber is an CVD (Chemical Vapor Deposition) chamber.

29. An apparatus for manufacturing semiconductor devices according to claim 21, wherein said first processing chamber is an RIE (Reactive Ion Etching) chamber or plasma etching chamber and said second processing chamber is an CVD (Chemical Vapor Deposition) chamber.

* * * * *